US006795614B2

(12) United States Patent
Segawa et al.

(10) Patent No.: US 6,795,614 B2
(45) Date of Patent: Sep. 21, 2004

(54) METHOD OF MAKING PHASE MASK FOR MACHINING OPTICAL FIBER AND OPTICAL FIBER HAVING BRAGG DIFFRACTION GRATING PRODUCED USING THE PHASE MASK FOR MACHINING OPTICAL FIBER

(75) Inventors: Toshikazu Segawa, Tokyo (JP);
Masaaki Kurihara, Tokyo (JP);
Tetsuro Komukai, Tokyo (JP);
Masataka Nakazawa, Tokyo (JP)

(73) Assignees: Dai Nippon Printing Co., Ltd., Tokyo (JP); Nippon Telegraph and Telephone Corporation, Tokyo (JP)

( * ) Notice: Subject to any disclaimer, the term of this patent is extended or adjusted under 35 U.S.C. 154(b) by 280 days.

(21) Appl. No.: 10/019,847

(22) PCT Filed: Feb. 27, 2001

(86) PCT No.: PCT/JP01/01446

§ 371 (c)(1),
(2), (4) Date: Oct. 25, 2001

(87) PCT Pub. No.: WO01/63325

PCT Pub. Date: Aug. 30, 2001

(65) Prior Publication Data

US 2003/0006212 A1 Jan. 9, 2003

(30) Foreign Application Priority Data

Feb. 28, 2000 (JP) ........................................ 2000-051487

(51) Int. Cl.[7] ................................................ G02B 6/34
(52) U.S. Cl. .............................. 385/37; 385/147; 65/31; 430/290
(58) Field of Search ........................... 385/37, 31, 147; 65/31

(56) References Cited

U.S. PATENT DOCUMENTS 5,327,515 A 7/1994 Anderson et al.

(List continued on next page.)

FOREIGN PATENT DOCUMENTS

EP 602829 6/1994

(List continued on next page.)

OTHER PUBLICATIONS

D.M. Tennant et al, Characterization of near–field holography grating masks for optoelectronics fabricated by electron beam lithography, Journal of Vacuum Science & Technology B, Nov./Dec. 1992, vol. 10, No. 6, pp. 2530–2535.

* cited by examiner

*Primary Examiner*—John D. Lee
*Assistant Examiner*—Sunk Pak
(74) *Attorney, Agent, or Firm*—Dellett & Walters (57) ABSTRACT

The present invention relates to a method of producing an optical fiber-processing phase mask having minimized connection errors that may degrade the spectral line shape and group delay characteristics of an optical fiber diffraction grating fabricated by using the phase mask. The present invention provides a method of producing an optical fiber-processing phase mask having a repeating pattern of grating-shaped grooves and strips provided on one surface of a transparent substrate, so that diffracted light produced by the repeating pattern is applied to an optical fiber to fabricate a diffraction grating in the optical fiber by interference fringes of diffracted light of different orders. In making a mask having a plurality of juxtaposed patterns ($P_1$ to $P_5$) having a linearly or nonlinearly increasing or decreasing pitch and a uniform groove-strip width ratio, multiple exposure is carried out to minimize difference between the pitch at the joint between patterns having different pitch data and the pitch in each individual pattern.

12 Claims, 12 Drawing Sheets

U.S. PATENT DOCUMENTS

| | | |
|---|---|---|
| 5,981,962 A | 11/1999 | Groves et al. |
| 6,214,495 B1 * | 4/2001 | Segawa et al. ............. 430/5 |
| 6,466,714 B1 * | 10/2002 | Kurihara et al. ............ 385/37 |
| 2002/0122626 A1 * | 9/2002 | Rothenberg et al. ........ 385/37 |
| 2003/0048988 A1 * | 3/2003 | Owen ........................ 385/37 |

FOREIGN PATENT DOCUMENTS

| | | |
|---|---|---|
| EP | 936505 | 8/1999 |
| EP | 940695 | 9/1999 |
| JP | 58-222523 | 12/1983 |
| JP | 59-143324 | 8/1984 |
| JP | 3-188617 | 8/1991 |
| JP | 6-36994 | 2/1994 |
| JP | 7-219243 | 8/1995 |
| JP | 9-80738 | 3/1997 |

METHOD OF MAKING PHASE MASK FOR MACHINING OPTICAL FIBER AND OPTICAL FIBER HAVING BRAGG DIFFRACTION GRATING PRODUCED USING THE PHASE MASK FOR MACHINING OPTICAL FIBER

TECHNICAL FIELD

The present invention relates to a method of producing a phase mask for processing an optical fiber and also relates to an optical fiber with a Bragg diffraction grating fabricated by using the optical fiber-processing phase mask. More particularly, the present invention relates to a method of producing a phase mask for fabricating a diffraction grating by using an ultraviolet laser beam in an optical fiber used for optical communications or the like. The present invention also relates to an optical fiber with a Bragg diffraction grating fabricated by using the mask.

BACKGROUND ART

Optical fibers have brought about a great revolution in global communications and allowed high-quality and large-capacity transoceanic telecommunications. It has heretofore been known that a Bragg diffraction grating is fabricated in an optical fiber by producing a periodic index profile in the core along the optical fiber, and the level of reflectivity of the diffraction grating and the width of the wavelength characteristics of the diffraction grating are determined by the period and length of the diffraction grating and the magnitude of refractive index modulation thereof, thereby allowing the diffraction grating to be used as a wavelength-division multiplexer for optical communications, a narrow-band high-reflecting mirror for use in a laser or a sensor, a wavelength selection filter for removing extra laser wavelengths in a fiber amplifier, etc.

However, the wavelength at which silica optical fibers exhibit a minimum attenuation and which is suitable for long-haul communication systems is 1.55 $\mu$m. Therefore, it is necessary in order to use an optical fiber diffraction grating at this wavelength that the grating spacing should be about 500 nm. At the beginning, it was deemed to be difficult to make such a fine structure in the core. To make a Bragg diffraction grating in the core of an optical fiber, the conventional practice is to carry out many complicated process steps including side polishing, photoresist process, holography exposure, reactive ion beam etching, etc. For this reason, the conventional practice suffers a long production time and a low yield.

However, there has recently been known a method of making a diffraction grating by irradiating an optical fiber with ultraviolet radiation to produce a refractive index change directly in the core of the optical fiber. The method using irradiation with ultraviolet radiation needs no complicated process. Therefore, increasing use has been made of the method using ultraviolet radiation with the progress of peripheral techniques.

With the method using ultraviolet radiation, because the grating spacing is as fine as about 500 nm, as has been stated above, the following methods are adopted: an interference method wherein two light beams are caused to interfere with each other; a method wherein writing is carried out for each point (single pulses from an excimer laser are focused to form diffraction grating surfaces one by one); a method wherein irradiation is effected by using a phase mask having a grating; and so forth.

The above-described interference method in which two light beams are caused to interfere with each other involves problems in terms of the quality of lateral beams, i.e. spatial coherence. The method wherein writing is carried out for each point needs precise step control of the order of sub-microns and requires writing many surfaces with light narrowed down. Therefore, the method suffers from a problem in terms of operability.

Figure 5A:
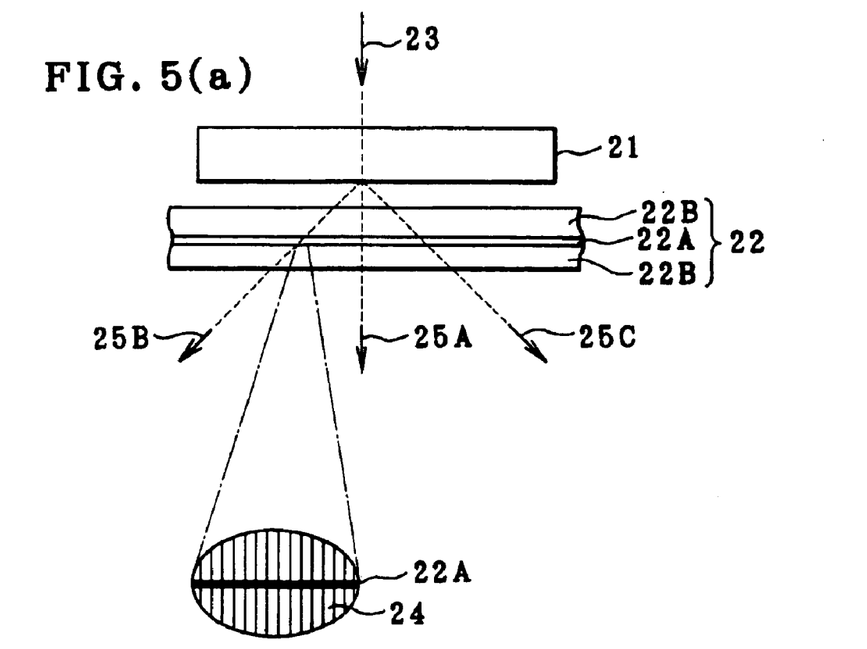
FIGS. 5(a) through 5(c) comprise diagrams for describing optical fiber processing and a phase mask used therefor.
Figure 5B:
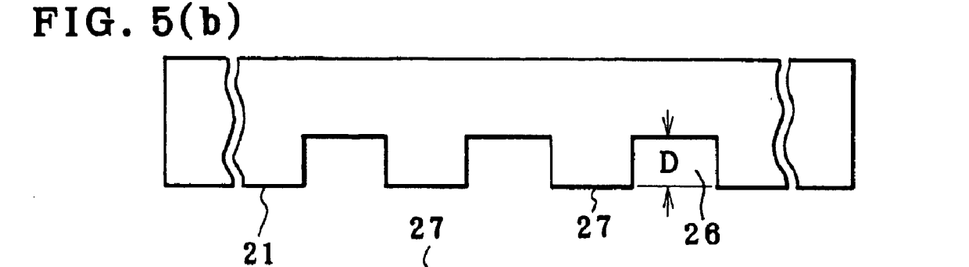
Figure 5C:
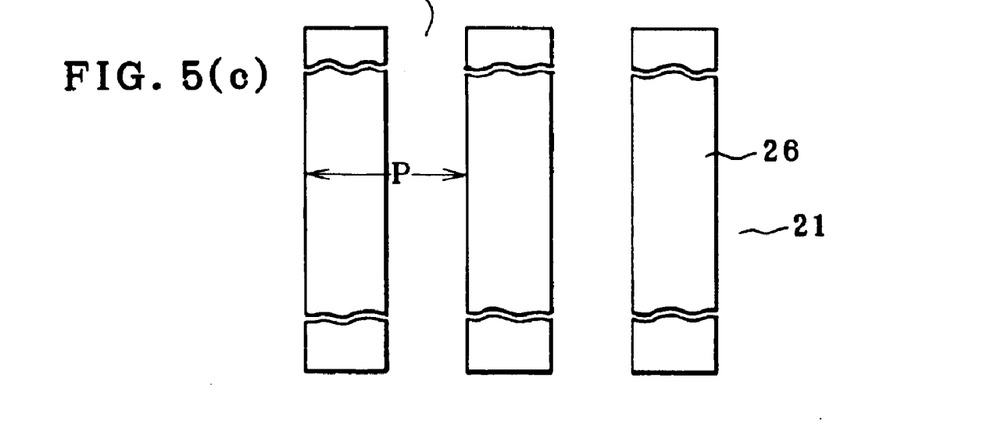

Accordingly, the irradiation method using a phase mask has attracted attention as a method capable of coping with the above-described problems. This method uses, as shown in FIG. 5(a), a phase shift mask 21 having grooves with a predetermined depth that are provided on one surface of a quartz substrate at a predetermined pitch. A KrF excimer laser beam (wavelength: 190 to 300 nm) 23 is applied to the mask 21 to produce a refractive index change directly in a core 22A of an optical fiber 22, thereby fabricating a grating (reference numeral 22B denotes a cladding of the optical fiber 22). It should be noted that in FIG. 5(a) an interference fringe pattern 24 in the core 22A is shown as enlarged so as to be readily understandable. FIG. 5(b) is a sectional view of the phase shift mask 21. FIG. 5(c) is a fragmentary top view corresponding to the sectional view. The phase shift mask 21 has a binary phase type diffraction grating structure in which grooves 26 with a depth D are provided on one surface of the phase shift mask 21 at a repeating pitch P, and a strip 27 with approximately the same width as that of each groove 26 is provided between each pair of adjacent grooves 26.

The depth D of the grooves 26 in the phase shift mask 21 (i.e. the height difference between the strips 27 and the grooves 26) is selected so that the phase of the excimer laser beam 23, which is exposure light, is modulated by a $\pi$ radian. Zeroth-order light (beam) 25A is reduced to 5% or less by the phase shift mask 21. Principal light (beam) emerging from the mask 21 is separated into plus 1st-order diffracted light 25B, which includes 35% or more of the diffracted light, and minus 1st-order diffracted light 25C. Thus, the optical fiber 22 is irradiated with interference fringes of predetermined pitch determined by the plus 1st-order diffracted light 25B and the minus 1st-order diffracted light 25C, thereby producing a refractive index change at this pitch in the optical fiber 22.

The grating fabricated in the optical fiber by using the above-described phase mask 21 has a uniform pitch. Therefore, the grooves 26 of the phase mask 21 used to fabricate the grating also have a uniform pitch.

To make such a phase mask, a quartz substrate coated with an electron beam resist is irradiated with an electron beam at regions corresponding to the grooves 26 by an electron beam writing system, and the irradiated regions are removed by etching.

Incidentally, there has recently been a demand for a chirped grating as a Bragg diffraction grating to be formed in optical fibers. The chirped grating is such a diffraction grating that the grating pitch increases or decreases linearly or nonlinearly according to the position in a direction (repeating direction of the grating) perpendicular to the grating grooves. Such a grating is used, for example, as a means for compensating for chromatic dispersion of a high-reflecting mirror having a widened reflection band or that of an optical fiber.

To make a grating in which the grating pitch changes linearly or nonlinearly according to the position in the longitudinal direction of the optical fiber, as stated above, on the basis of the interference of plus 1st-order diffracted light and minus 1st-order diffracted light by using a phase mask, it is necessary that the pitch of the grooves of the phase mask should increase or decrease linearly or nonlinearly according to the position as well, as will be clear from the principle shown in FIG. 5(a) (as the pitch of the grooves of the phase mask decreases, the angle formed between the plus 1st-order diffracted light and the minus 1st-order diffracted light increases, and the pitch of the interference fringes decreases). To make such a phase mask by writing using an electron beam writing system, the conventional practice needs a large amount of writing data for writing grooves or strips between them over the whole area of the mask. Accordingly, there are cases where it is difficult to produce the phase mask. The writing data may have errors occurring in relation to the address grid.

Figure 16:
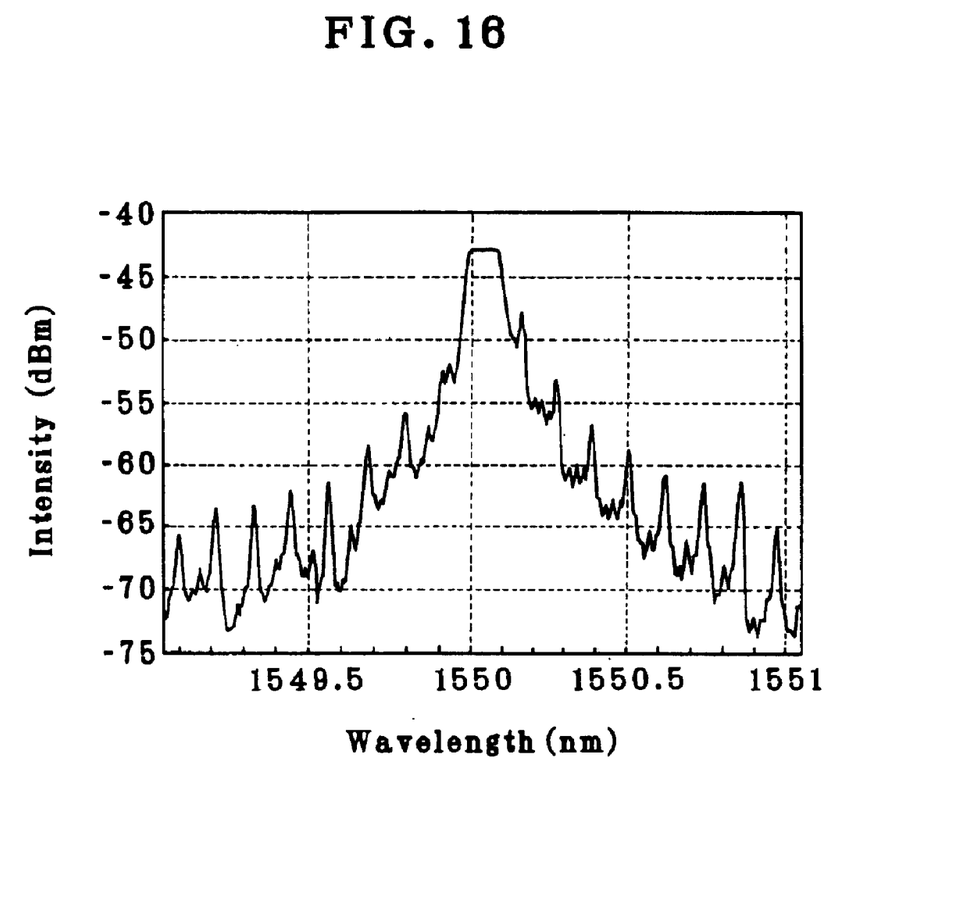
FIG. 16 is a diagram showing the reflection characteristics of an example of conventional optical fibers with a Bragg diffraction grating.

In fabricating a grating in which the grating pitch changes linearly or nonlinearly, the problem of pitch deviation (connection error) may arise at the joint between patterns different in grating pitch from each other. An optical fiber diffraction grating fabricated by using a phase mask containing such connection errors produces a large number of unwanted peaks other than the desired peak of the spectrum, as shown in FIG. 16, by way of example, which illustrates reflection characteristics. In a chirped grating, the connection errors result in ripples in the group delay characteristics. This may give rise to a serious problem when the chirped grating is used to compensate for dispersion of the optical fiber.

DISCLOSURE OF THE INVENTION

The present invention was made in view of the above-described problems with the prior art. An object of the present invention is to provide a method of producing an optical fiber-processing phase mask having minimized connection errors that may degrade the spectral line shape and group delay characteristics of an optical fiber diffraction grating fabricated by using the phase mask. The present invention also includes an optical fiber with a Bragg diffraction grating fabricated by using such an optical fiber-processing phase mask.

To attain the above-described object, the present invention provides a method of producing an optical fiber-processing phase mask having a repeating pattern of grating-shaped grooves and strips provided on one surface of a transparent substrate, so that diffracted light produced by the repeating pattern is applied to an optical fiber to fabricate a diffraction grating in the optical fiber by interference fringes of diffracted light of different orders. In making a mask having a plurality of juxtaposed patterns having a linearly or nonlinearly increasing or decreasing pitch and a uniform groove-strip width ratio, multiple exposure is carried out to minimize difference between the pitch at the joint between patterns having different pitch data and the pitch in each individual pattern.

In this case, when the plurality of patterns having different pitch data are written in juxtaposition with each other by multiple exposure, multiple writing operations may be carried out in the same direction. Alternatively, the multiple writing operations may be carried out in opposite directions.

The pitch of the repeating pattern of grating-shaped grooves and strips is set so as to vary usually between 0.85 μm and 1.25 μm in order to reflect light in the near infrared region.

It is desirable that the difference in height between the grooves and strips of the repeating pattern of grating-shaped grooves and strips should be of such a magnitude that a phase shift of approximately π occurs when ultraviolet radiation for processing the optical fiber passes through the phase mask.

The arrangement may be such that the repeating pattern of grating-shaped grooves and strips is based on writing data concerning a basic pattern consisting of one groove and one strip, and the patterns of grooves and strips having different pitches are continuously written by using the writing data concerning the basic pattern while varying the reduced scale for the writing data.

In this case, it is desirable that a change in pitch according to position of the repeating pattern of grating-shaped grooves and strips should be determined according to a change in pitch of the diffraction grating to be fabricated in the optical fiber and should be given by a change according to the reduced scale for the writing data concerning the basic pattern.

It should be noted that writing may be performed by an electron beam writing system or a laser beam writing system.

The present invention also includes an optical fiber with a Bragg diffraction grating fabricated by using an optical fiber-processing phase mask produced by any one of the above-described production methods.

The optical fiber with a Bragg diffraction grating is used to compensate for dispersion of the optical fiber, for example. The group delay ripple of the optical fiber with a Bragg diffraction grating is within ±10 ps.

Figure 1:
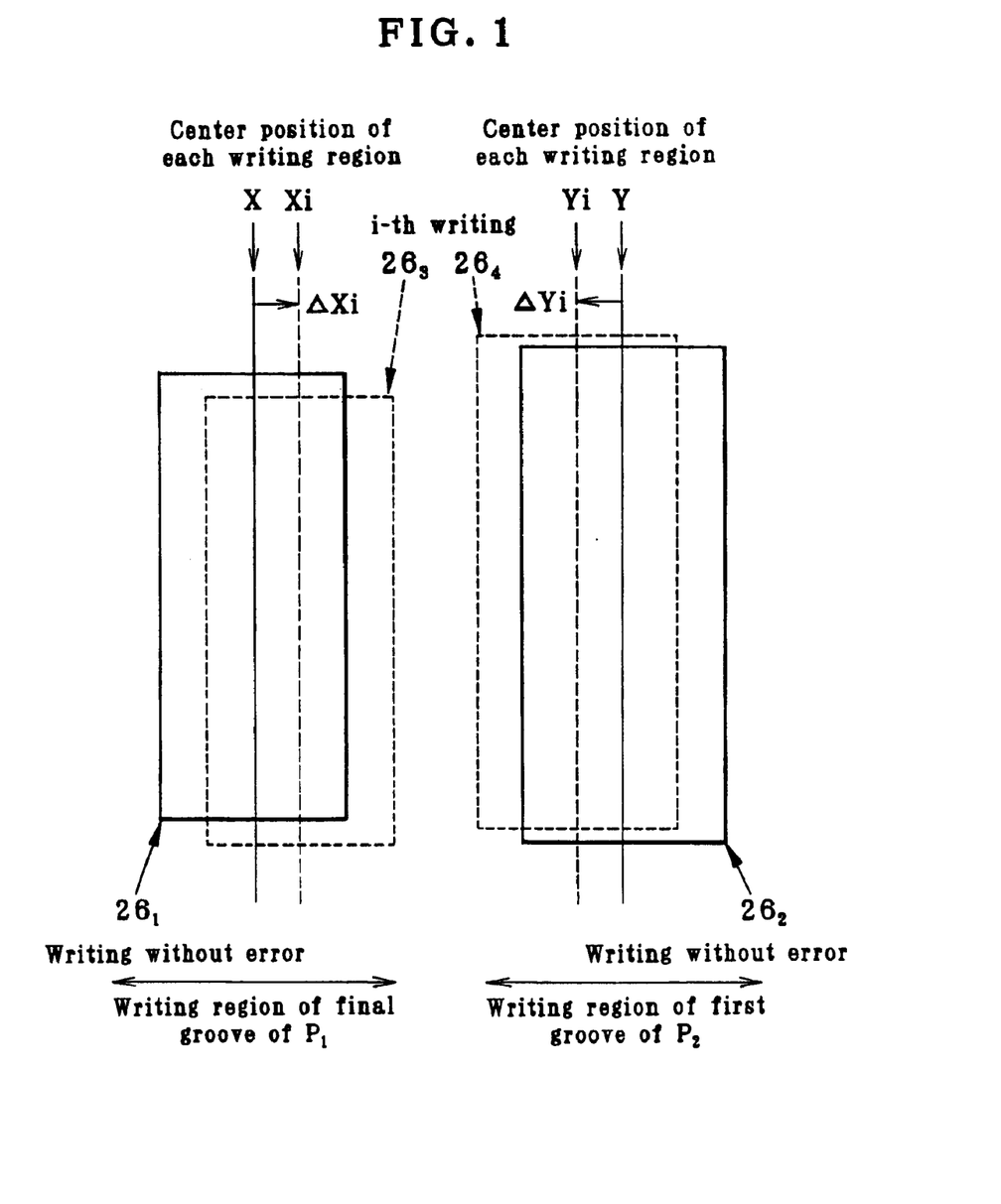
FIG. 1 is a diagram for describing the principle that the connection error at the joint between patterns is minimized by the present invention.

In the present invention, multiple exposure is carried out to make a mask having a plurality of juxtaposed patterns with a uniform groove-strip width ratio. Therefore, positional inaccuracies are averaged as shown in FIG. 1, so that the connection error at the joint between patterns having different pitches decreases. Accordingly, it is possible to minimize connection errors occurring when patterns having different pitches are connected in juxtaposition with each other as in the prior art. In an optical fiber with a Bragg diffraction grating fabricated by using such a phase mask, unwanted peaks other than the desired peak of the spectrum are reduced. In addition, ripples in the group delay characteristics are reduced.

The production method according to the present invention is useful for both a process in which patterns are written with the reduced scale factor being varied, and a process in which repeating pattern data of grating-shaped grooves and strips, which have different pitches, are written in juxtaposition with each other.

BEST MODE FOR CARRYING OUT THE INVENTION

The method of producing an optical fiber-processing phase mask according to the present invention will be described below on the basis of embodiments thereof.

Figure 2A:
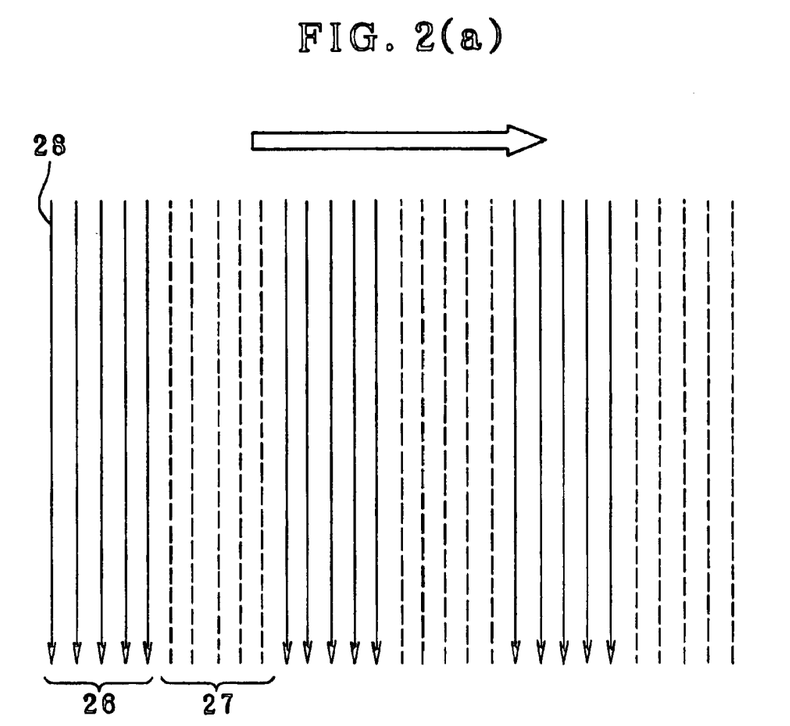
FIGS. 2(a) and 2(b) comprise diagrams showing an electron beam writing method used in the method of producing a phase mask, and also showing a section of the phase mask.
Figure 2B:
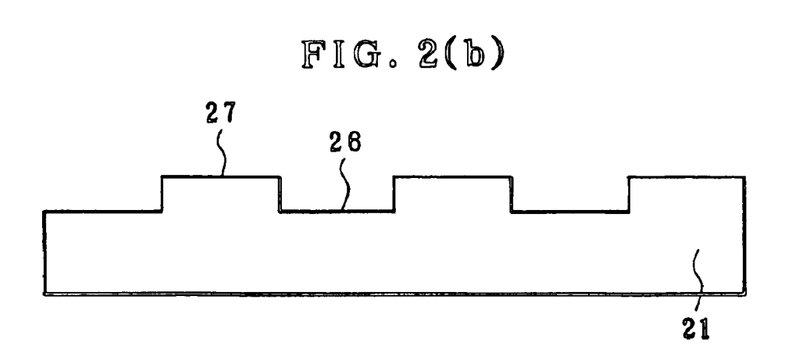

FIG. 2(b) shows a sectional view of a part in the longitudinal direction of a phase mask 21 for fabricating a Bragg diffraction grating in an optical fiber by a setup such as that shown in FIG. 5(a). The phase mask 21 has a repeating pattern of grooves 26 and strips 27 alternating with each other. The grooves 26 and the strips 27 of the mask 21 are formed as shown in the top view in FIG. 2(a). The surface of a quartz substrate coated with an electron beam resist (see FIG. 4) is subjected to raster scan to carry out writing in such a manner that scanning lines 28 of the electron beam extend in a direction parallel to the grooves 26, thereby exposing the grooves 26. The strips 27 are made by blanking the electron beam scanning as shown by the broken lines in the figure. The exposure for the whole mask 21 of continuous length according to the present invention is carried out by the following method. Raster scan is performed in the direction indicated by the double arrow in FIG. 2(a) (i.e. a direction perpendicular to the grooves 26 and the strips 27). As has been stated above, at a position where a groove 26 is to be written, actual scan is performed with a predetermined number of scanning lines (5 scanning lines in the case of the illustrated example), and at the subsequent position where a strip 27 is to be written, scan is made blank for the same number of scanning lines. This is repeated successively many times, whereby the phase mask 21 with a predetermined length is subjected to electron beam exposure at once.

Figure 6:
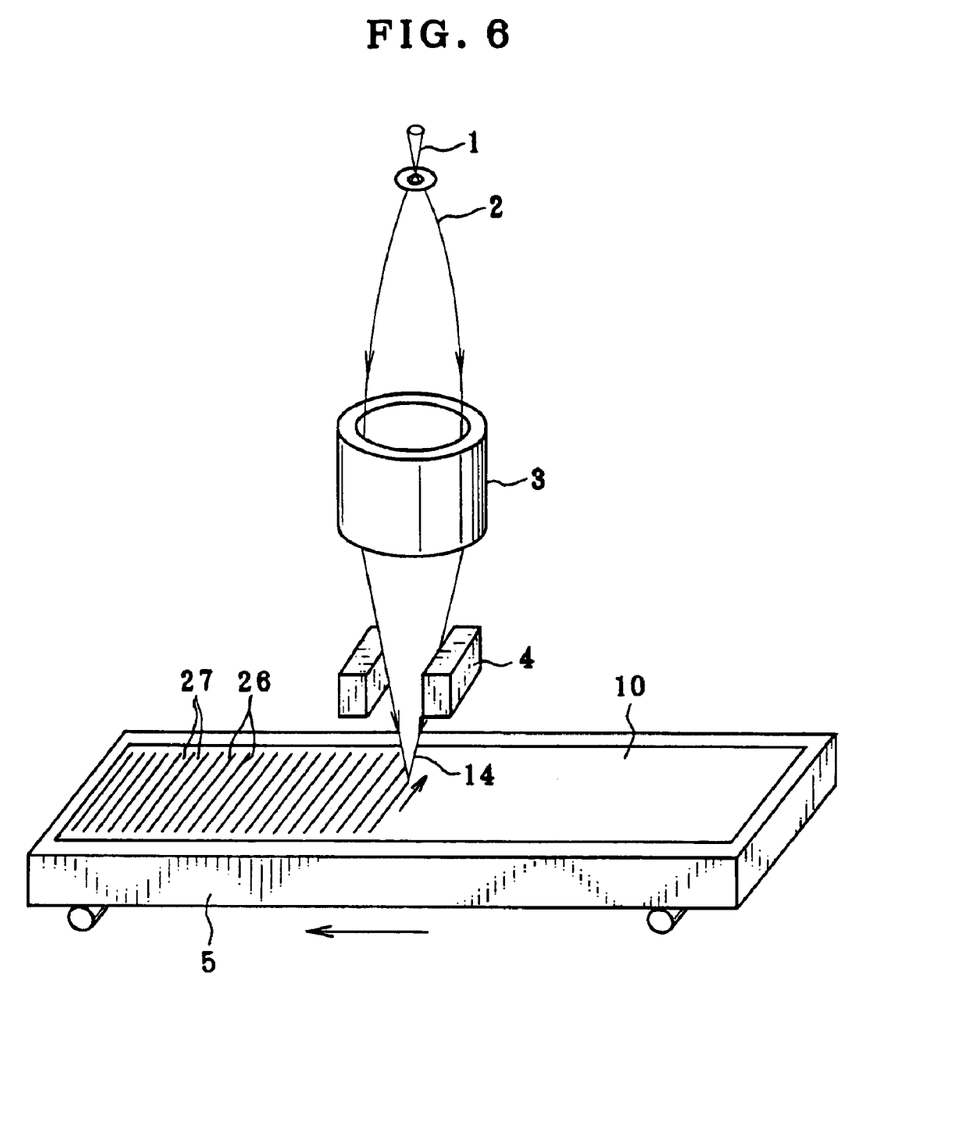
FIG. 6 is a diagram schematically showing the way in which a phase mask pattern is written with an electron beam by using an electron beam writing system.

More specifically, the method uses an electron beam writing system comprising, as shown schematically in FIG. 6, an electron gun 1, an electron lens 3 for converging an electron beam 2 emitted from the electron gun 1, an electron beam deflector 4 for deflecting the converged electron beam 14, and a writing stage 5 movable in a direction (Y-direction) perpendicular to the scanning direction of the converged electron beam 14 scanned in one direction (X-direction) by the electron beam deflector 4. A phase mask blank 10 comprising a quartz substrate coated with an electron beam resist is placed on the writing stage 5. While the writing stage 5 is being fed at a constant speed in a direction (Y-direction) perpendicular to the scanning direction, the grooves 26 are written on the phase mask blank 10 at predetermined repeating intervals with the converged electron beam 14 deflected in the scanning direction (X-direction).

Figure 3:
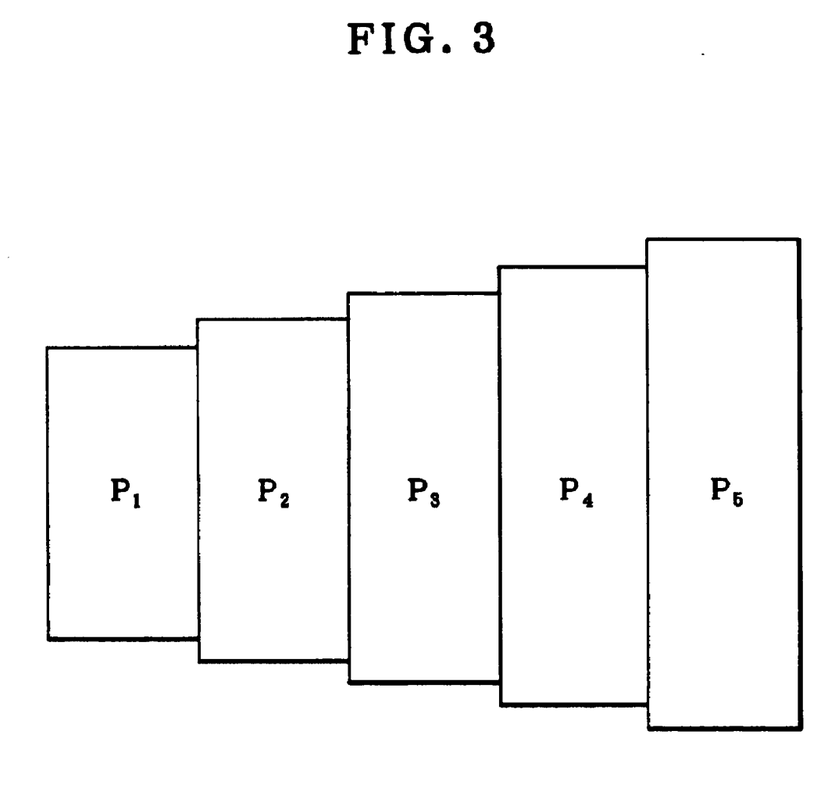
FIG. 3 is a diagram showing the way in which a pattern having a varying pitch is written by connecting together patterns having different pitches.

At this time, multiple exposure is carried out over the entire pattern area to minimize connection errors. The principle of this method will be described below. FIG. 3 is a diagram showing the way in which a pattern having a linearly or nonlinearly increasing or decreasing pitch is written by connecting together patterns $P_1$ to $P_5$ having different pitches. That is, the patterns $P_1$ to $P_5$ are written successively and, while doing so, they are connected to one another. At this time, the boundary between each adjacent patterns, which forms a strip, may become narrower or wider than the desired set value owing to a connection error in the actual practice. Connection errors would form singular points on a fiber grating fabricated by using a phase mask having the connection errors, causing a large number of unwanted peaks other than the desired peak of the spectrum, as has been described in connection with FIG. 16. In a chirped grating, the connection errors result in ripples in the group delay characteristics. This may give rise to a serious problem when the chirped grating is used to compensate for dispersion of the optical fiber.

FIG. 1 is a diagram showing the boundary between the patterns $P_1$ and $P_2$. Reference numeral $26_1$ denotes the final groove portion (solid line) of $P_1$ as written and exposed without an error. Reference numeral $26_2$ denotes the first groove portion (solid line) of $P_1$ as written and exposed without an error. Reference numeral $26_3$ denotes the final groove portion (broken line) of $P_1$ as multiple-exposed by the i-th writing process. Reference numeral $26_4$ denotes the first groove portion (broken line) of $P_2$ as multiple-exposed by the i-th writing process. $\Delta Xi$ represents the difference between the center position X of $26_1$ and the center position Xi of $26_3$. $\Delta Yi$ represents the difference between the center position Y of $26_2$ and the center position Yi of $26_4$. It should be noted that FIG. 1 shows the groove portions in consideration of a case where errors occur in both the grating repeating direction and the direction parallel to the grating grooves. When errors occur only in the grating repeating direction, there is no error between the solid- and broken-line positions at each end in the direction parallel to the grating grooves.

If the portion exposed at the i-th time alone is considered, the connection error between $P_1$ and $P_2$ is given by $\Delta Yi-\Delta Xi$. Incidentally, when multiple exposure is carried out N times, the final pattern connection error is $(\Delta Y_1+ \ldots +\Delta Y_N)/N-(\Delta X_1+ \ldots +\Delta X_N)/N$. However, when i is 2 or more, the probability of the error $(\Delta Y_1+ \ldots +\Delta Y_N)/N(\Delta X_1+ \ldots +\Delta X_N)/N$ becoming smaller than $\Delta Y_1-\Delta X_1$ is high statistically. This means that the connection error between $P_1$ and $P_2$ is made likely to decrease by multiple exposure. The same is the case with the connection between other patterns. After all, multiple exposure allows connection errors to decrease as a whole.

In this case, each pattern is written with a smaller exposure dose than usual at all writing regions. Subsequently, each pattern is multiple-exposed at all the regions in such a manner as to overlap other patterns. When the number of times of writing each pattern in such a manner that the patterns overlap each other is one, the exposure dose is a half of that in the conventional method. It is necessary that as the number of times of overlapping increases, the exposure dose should be reduced to a factor of the number of times of overlapping with respect to the exposure dose used in the conventional method. It should be noted that writing may be performed by using an electron beam writing system. Alternatively, a laser beam writing system may be used.

Figure 9:
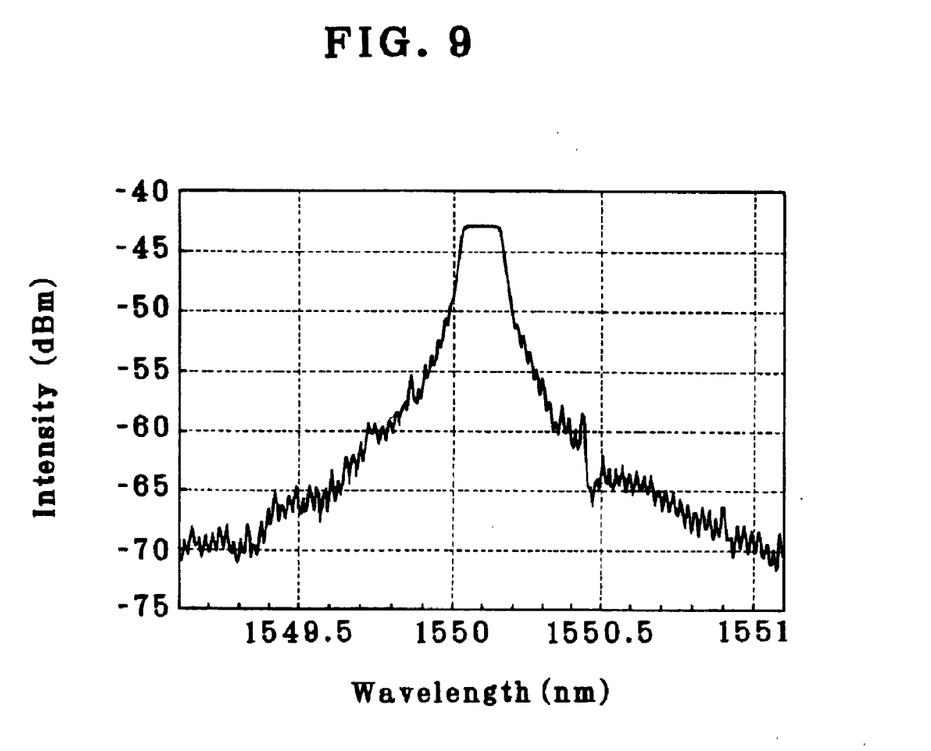
FIG. 9 is a diagram showing the reflection characteristics of an optical fiber with a Bragg diffraction grating fabricated by a specific example of the present invention.

As a specific example, a silica optical fiber improved in photosensitivity by loading it with high-pressure hydrogen was used as a photosensitive optical fiber 22 (FIG. 5), and refractive index modulation was produced directly in the core 22A of the photosensitive optical fiber 22 by the setup shown in FIG. 5(a) using a phase mask 21 with a length of 35 mm and a uniform pitch continuously exposed by the above-described method of the present invention and produced through the following steps. It should be noted, however, that an argon SHG laser (wavelength: 244 nm) was used as an ultraviolet radiation laser light source. The reflection characteristics of an optical fiber with a Bragg diffraction grating fabricated in this way are shown in FIG. 9 (in FIG. 9, the abscissa axis represents wavelength, and the ordinate axis represents intensity). As will be clear from comparison to FIG. 16, undesired peaks are reduced.

The steps of producing the above-described phase mask 21 will be described below.

As basic pattern data, writing data for one pitch consisting of 10 scanning lines, which comprises an address unit of 0.125 $\mu$m, is prepared. A reduced scale is given by (desired grating pitch)/(0.125×10). By using the reduced scale and the basic pattern data, an electron beam resist applied to the surface of a transparent substrate is subjected to writing by an electron beam writing system. The following is a description of an example of the phase mask producing method according to the present invention, which uses the above-described writing method.

FIG. 4 is a sectional view showing the steps of this example. In FIG. 4, reference numerals denote as follows: 10 denotes a blank for a phase mask; 11 denotes a quartz substrate; 12 denotes a chromium thin film; 12A denotes a chromium thin film pattern; 12B denotes chromium thin film openings; 13 denotes an electron beam resist; 13A denotes a resist pattern; 13B denotes resist openings; 14 denotes electron beam; 21 denotes a phase mask; 26 denotes grooves; and 27 denotes strips.

Figure 4A:
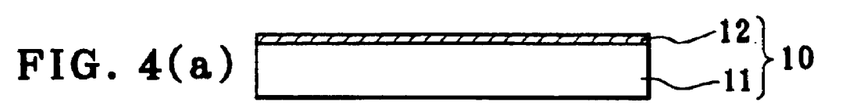
FIGS. 4(a) through 4(h) are sectional views showing steps of an embodiment of the phase mask producing method according to the present invention.

First, as shown in FIG. 4(a), a blank 10 having a chromium thin film 12 grown to a thickness of 150 Å on a quartz substrate 11 by sputtering was prepared. The chromium thin film 12 is useful for preventing charge-up when the electron beam resist 13 is irradiated with an electron beam 14 at a subsequent step, and serves as a mask when grooves 26 are made in the quartz substrate. The control of the thickness of the chromium thin film 12 is important also from the viewpoint of resolution in etching of the chromium thin film. An appropriate chromium thin film thickness is 100 to 200 Å.

Figure 4B:
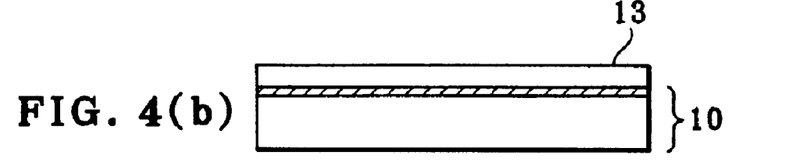

Next, as shown in FIG. 4(b), an electron beam resist 13 was applied to a thickness of 400 nm and dried.

Figure 4C:
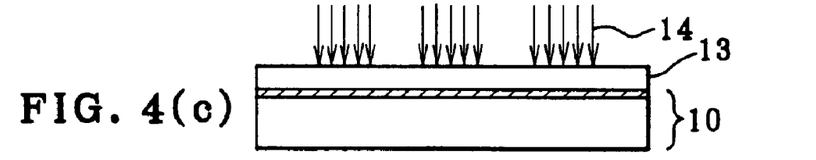
Figure 7:
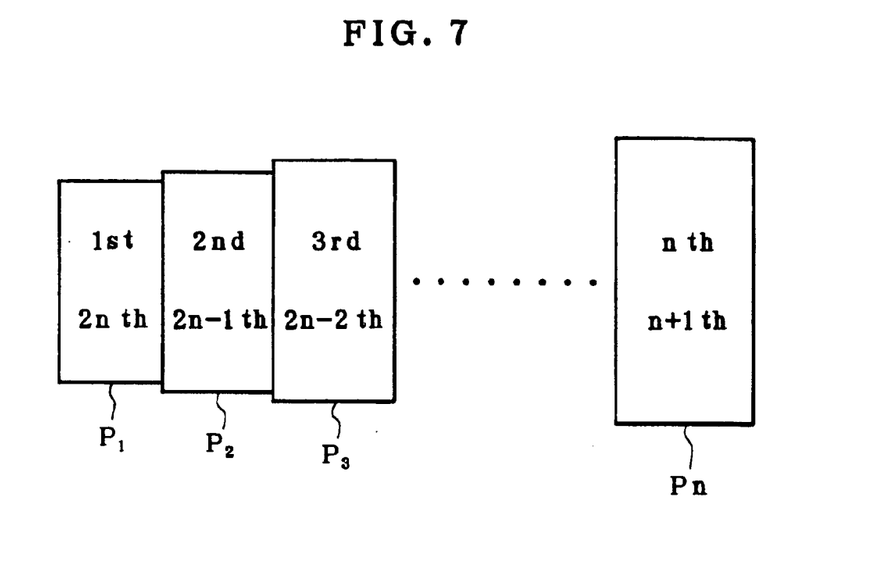
FIG. 7 is a diagram showing the way in which a plurality of patterns having different pitches are written by multiple writing operations carried out in opposite directions.
Figure 8:
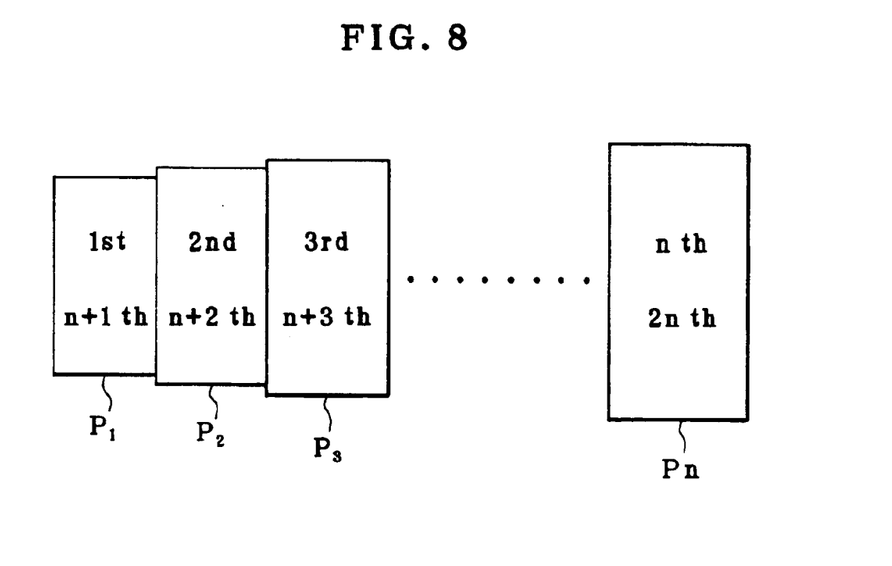
FIG. 8 is a diagram showing the way in which a plurality of patterns having different pitches are written by multiple writing operations carried out in the same direction.

Thereafter, as shown in FIG. 4(c), the electron beam resist 13 was subjected to writing at an exposure dose of 0.6 $\mu$C/cm$^2$ by an electron beam writing system MEBESIII (manufactured by ETEC) to write a plurality of juxtaposed patterns each comprising grooves and strips of the same pitch. Subsequently, the same patterns were written at 0.6 $\mu$C/cm$^2$ in such a manner as to be superimposed on the first-written patterns. At this time, the writing sequence is reversed, as shown in FIG. 7. It should be noted that the direction of the second writing may be the same as that of the first writing, as shown in FIG. 8.

Figure 4D:
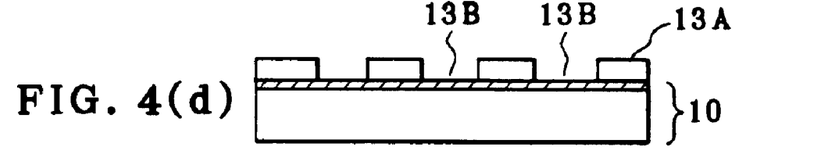

After exposure, baking (PEB: Post Exposure Baking) was carried out for 5 minutes at 90° C. Thereafter, the electron beam resist 13 was developed with TMAH (tetramethyl ammonium hydroxide) having a concentration of 2.38% to form a desired resist pattern 13A as shown in FIG. 4(d). It should be noted that the post exposure baking (PEB) is carried out to increase the sensitivity selectively at the portions irradiated with the electron beam 14.

Figure 4E:
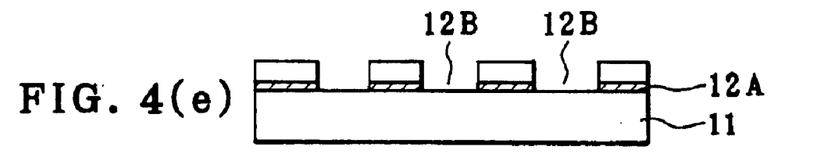

Next, with the resist pattern 13A used as a mask, dry etching was performed by using $CH_2Cl_2$ gas to form a chromium thin film pattern 12A as shown in FIG. 4(e).

Figure 4F:
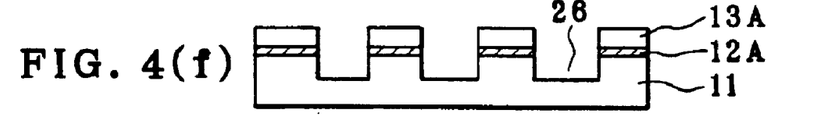

Next, as shown in FIG. 4(f), with the chromium thin film pattern 12A used as a mask, the quartz substrate 11 was etched to a depth of 240 nm by using $CF_4$ gas. The control of the depth is effected by controlling the etching time. It is possible to perform etching under control in the depth range of 200 to 400 nm.

Figure 4G:
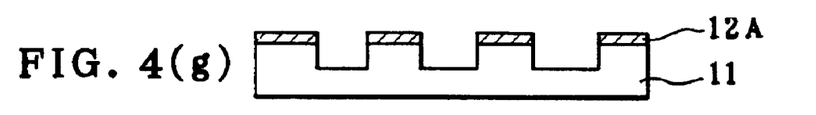
Figure 4H:
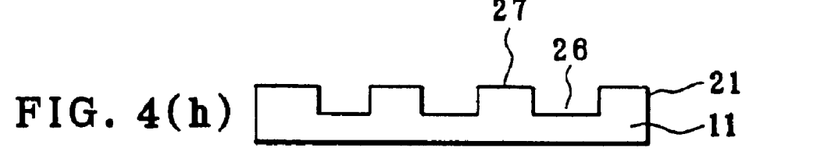

Thereafter, as shown in FIG. 4(g), the resist pattern 13A was removed with sulfuric acid at 70° C. Next, as shown in FIG. 4(h), the chromium thin film pattern 12A was removed by etching with a ceric nitrate ammonium solution, followed by a cleaning treatment, thereby completing a phase mask 21 having lines (strips 27) and spaces (grooves 26) with a depth 240 nm and a pitch of 1.07 $\mu$m.

By using this phase mask, a diffraction grating was formed in the core of an optical fiber. Wide-band light with a 1.55 $\mu$m band was input into the optical fiber, and the reflection spectrum of the diffraction grating was measured. As a result, it was possible to obtain a spectrum having reduced noise components as shown in FIG. 9.

Figure 10:
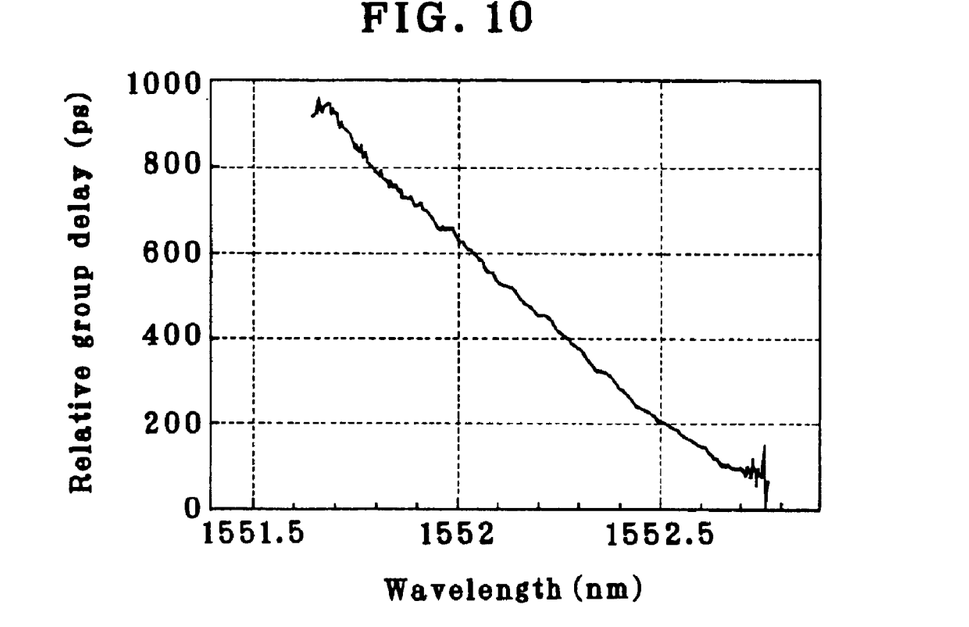
FIG. 10 is a diagram showing the group delay characteristics of a linear chirped fiber grating fabricated by using a chirped phase mask made by performing writing once.
Figure 11:
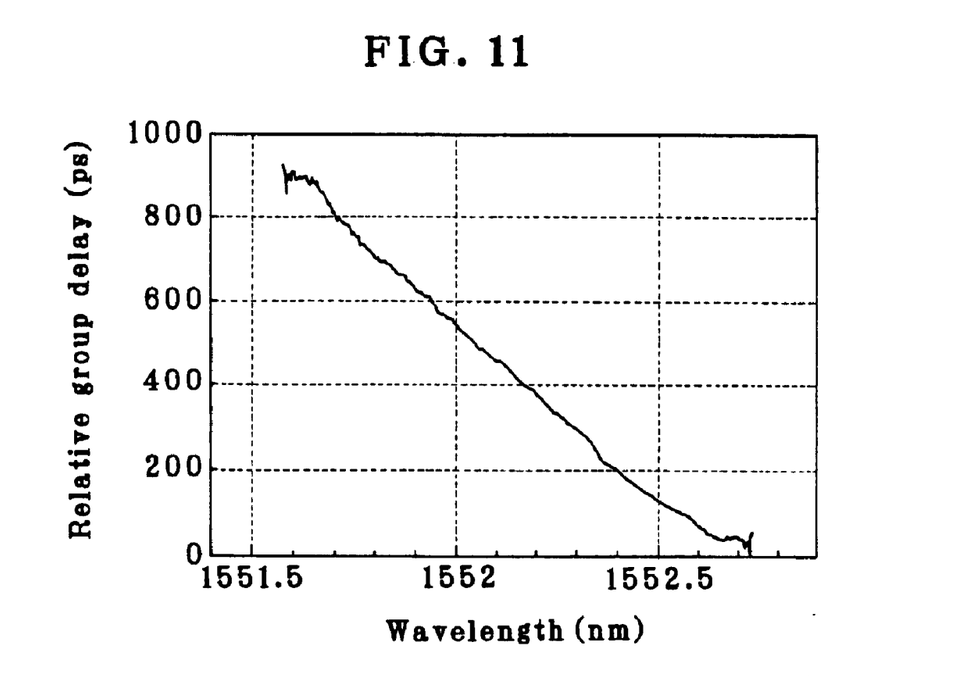
FIG. 11 is a diagram showing the group delay characteristics of a linear chirped fiber grating fabricated by using a chirped phase mask made by performing writing twice.
Figure 12:
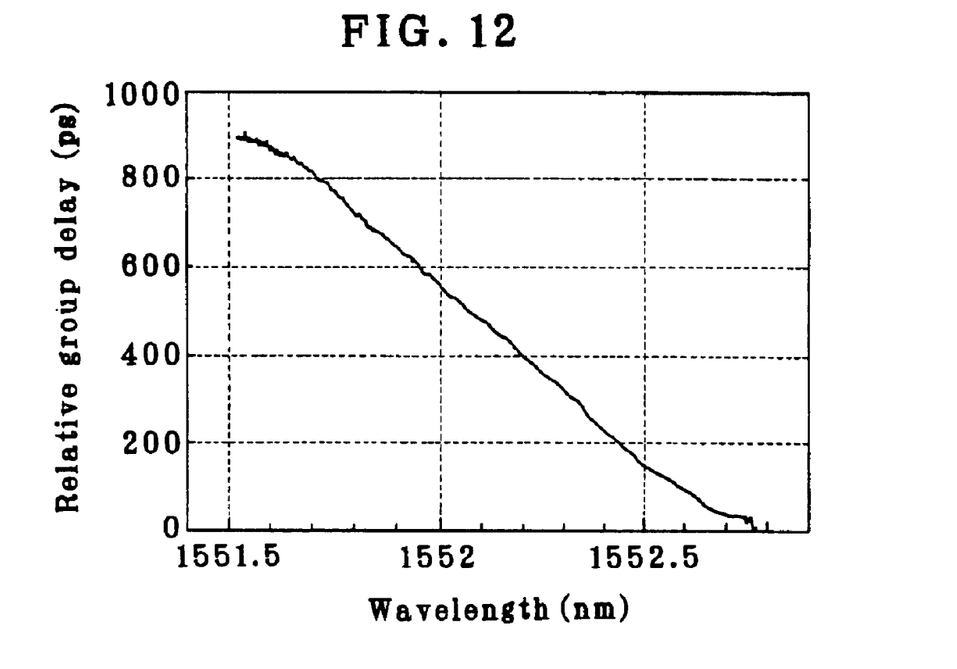
FIG. 12 is a diagram showing the group delay characteristics of a linear chirped fiber grating fabricated by using a chirped phase mask made by performing writing four times.

The foregoing is an example of improving the reflection spectrum of a fiber grating with a uniform pitch. The use of the present invention also makes it possible to improve the group delay characteristics of a chirped fiber grating in which the pitch changes linearly or nonlinearly in the longitudinal direction. FIGS. 10 to 12 show the respective group delay characteristics of linear chirped fiber gratings fabricated by using three different types of chirped phase masks different in the number of times of writing. In these figures, the abscissa axis represents wavelength, and the ordinate axis represents relative group delay. The linear chirped fiber gratings had a length of 100 mm, a bandwidth (full width at half maximum) of about 1 nm and a reflectivity of 99%. It should be noted that the chirped phase masks used to fabricate the linear chirped fiber gratings were made through steps similar to those in the case of making the above-described phase mask having a uniform pitch by connecting together 100 patterns written in juxtaposition with each other so as to have different pitches changing linearly from 1.0722 $\mu$m to 1.0730 $\mu$m according to the following equation:

$$\Lambda(i)=(\Lambda_0+\Delta\Lambda\times i)/n$$

($\Lambda(i)$ is the pitch of the i-th pattern, and n is the refractive index of the core of the optical fiber)

Figure 13:
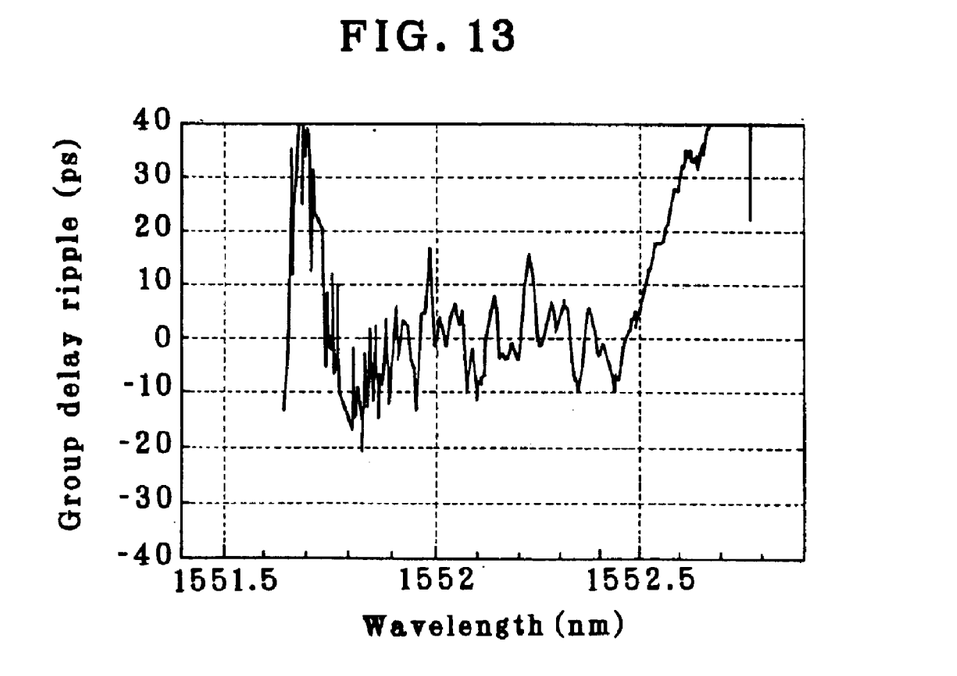
FIG. 13 is a diagram showing the group delay ripple in the case of FIG. 10.
Figure 14:
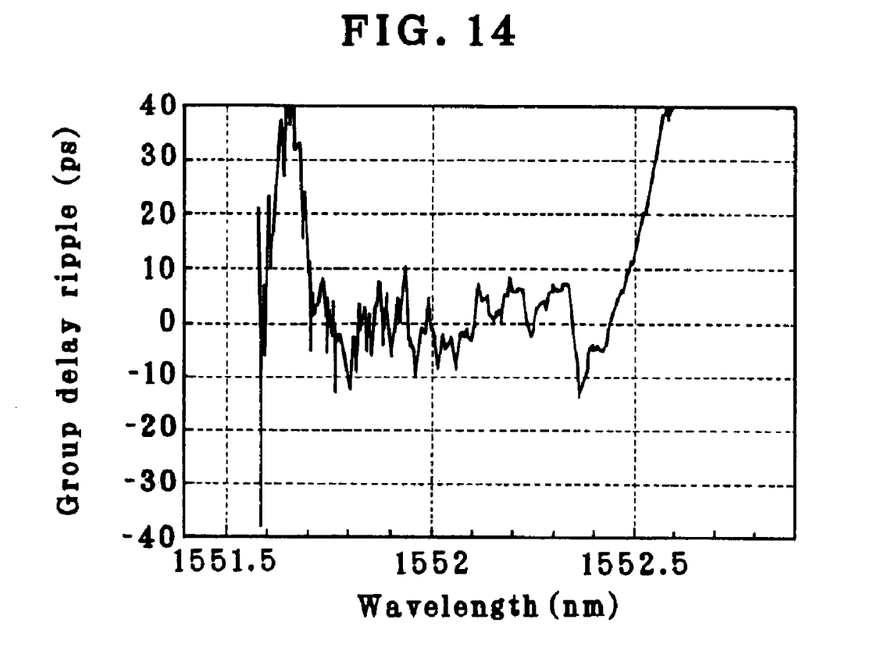
FIG. 14 is a diagram showing the group delay ripple in the case of FIG. 11.
Figure 15:
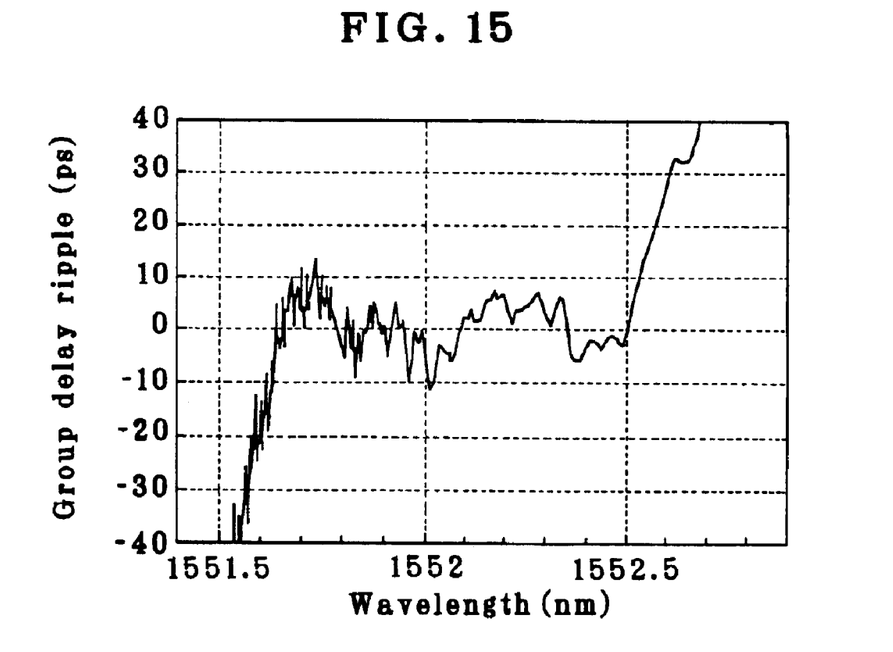
FIG. 15 is a diagram showing the group delay ripple in the case of FIG. 12.

FIG. 10 shows the group delay characteristics of the linear chirped fiber grating obtained by the conventional making method, i.e. by using a mask produced by carrying out the writing process only once. FIG. 11 shows the groups delay characteristics of the linear chirped fiber grating fabricated by using a mask produced by carrying out the writing process twice. FIG. 12 shows the group delay characteristics of the linear chirped fiber grating fabricated by using a mask produced by carrying out the writing process four times. It is clear that as the number of times at which writing is carried out increases, the linear chirped fiber grating obtained by using the mask exhibits smoother group delay characteristics. FIGS. 13 to 15 show the respective deviations from a straight line of the group delay characteristics in FIGS. 10 to 12 obtained by rectilinear congruence, which means the group delay ripple. In these figures, the abscissa axis represents wavelength, and the ordinate axis represents group delay ripple. In FIG. 13, the group delay ripple is of the order of ±15 ps. In FIG. 14, the group delay ripple is of the order of ±10 ps. In FIG. 15, the group delay ripple is within ±10 ps.

Although the method of producing an optical fiber-processing phase mask according to the present invention, together with an optical fiber with a Bragg diffraction grating fabricated by using the optical fiber-processing phase mask, have been described above on the basis of embodiments thereof, the present invention is not limited to the foregoing embodiments but can be modified in a variety of ways. It should be noted that although in the foregoing invention a raster scan type system is used as an electron beam writing system, the present invention is also applicable to cases where a vector scan or other type of electron beam writing system is used.

INDUSTRIAL APPLICABILITY

As will be clear from the foregoing description, according to the present invention, multiple exposure is carried out to make a mask having a plurality of juxtaposed patterns with a uniform groove-strip width ratio. Therefore, positional inaccuracies are averaged, so that the connection error at the joint between patterns having different pitches decreases. Consequently, in a fiber grating having a uniform pitch, no unwanted peak occurs at either side of the central Bragg wavelength. Accordingly, wavelength selectivity is improved. In a chirped fiber grating in which the pitch changes linearly or nonlinearly, ripples in the group delay characteristics are reduced. Thus, dispersion compensation characteristics are improved markedly.

What is claimed is:

1. A method of producing an optical fiber-processing phase mask having a repeating pattern of grating shaped grooves and strips provided on one surface of a transparent substrate, so that diffracted light produced by the repeating pattern is applied to an optical fiber to fabricate a diffraction grating in the optical fiber by interference fringes of diffracted light of different orders, said method being characterized in that in making a mask having a plurality of juxtaposed patterns having a linearly or nonlinearly increasing or decreasing pitch and a uniform groove strip width ratio, multiple exposure is carried out to minimize difference between a pitch at a joint between patterns having different pitch data and a pitch in each individual pattern.

2. A method of producing an optical fiber-processing phase mask according to claim 1, wherein when said plurality of patterns having different pitch data are written in juxtaposition with each other by multiple exposure, multiple writing operations are carried out in a same direction.

3. A method of producing an optical fiber-processing phase mask according to claim 1, wherein when said plurality of patterns having different pitch data are written in juxtaposition with each other by multiple exposure, multiple writing operations are carried out in opposite directions.

4. A method of producing an optical fiber-processing phase mask according to any one of claims 1 to 3, wherein said repeating pattern of grating shaped grooves and strips has a pitch varying between 0.85 µm and 1.25 µm.

5. A method of producing an optical fiber-processing phase mask according to any one of claims 1 to 3, wherein a difference in height between the grooves and strips of said repeating pattern of grating-shaped grooves and strips is of such a magnitude that a phase shift of approximately $\pi$ occurs when ultraviolet radiation for processing the optical fiber passes through said phase mask.

6. A method of producing an optical fiber-processing phase mask according to any one of claims 1 to 3, wherein said repeating pattern of grating shaped grooves and strips is based on writing data concerning a basic pattern consisting of one groove and one strip, and said patterns of grooves and strips having different pitches are continuously written by using the writing data concerning the basic pattern while varying a reduced scale for said writing data.

7. A method of producing an optical fiber-processing phase mask according to claim 6, wherein a change in pitch according to position of said repeating pattern of grating shaped grooves and strips is determined according to a change in pitch of the diffraction grating to be fabricated in the optical fiber and given by a change according to the reduced scale for said writing data.

8. A method of producing an optical fiber-processing phase mask according to any one of claims 1 to 3, wherein writing is performed by an electron beam writing system.

9. A method of producing an optical fiber-processing phase mask according to any one of claims 1 to 3, wherein writing is performed by a laser beam writing system.

10. An optical fiber with a Bragg diffraction grating characterized by being fabricated by using an optical fiber-processing phase mask produced by the method according to any one of claims 1 to 3.

11. An optical fiber with a Bragg diffraction grating according to claim 10, which is used to compensate for dispersion of the optical fiber.

12. An optical fiber with a Bragg diffraction grating according to claim 11, wherein a group delay ripple is within ±10 ps.

* * * * *